(12) United States Patent
Wong et al.

(10) Patent No.: US 11,452,232 B2
(45) Date of Patent: Sep. 20, 2022

(54) ELECTRONIC DEVICE

(71) Applicant: ASUSTeK COMPUTER INC., Taipei (TW)

(72) Inventors: Chun-Chieh Wong, Taipei (TW); Cheng-Yu Wang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/132,139

(22) Filed: Dec. 23, 2020

(65) Prior Publication Data

US 2021/0219457 A1 Jul. 15, 2021

(30) Foreign Application Priority Data

Jan. 10, 2020 (TW) .................................. 109100983

(51) Int. Cl.
*H05K 7/20* (2006.01)
*G06F 1/20* (2006.01)

(52) U.S. Cl.
CPC ......... *H05K 7/20145* (2013.01); *G06F 1/203* (2013.01)

(58) Field of Classification Search
CPC .......... G06F 1/203; G06F 1/20; G06F 1/1656; H05K 7/20145
See application file for complete search history.

(56) References Cited

U.S. PATENT DOCUMENTS

| 5,949,646 | A | * | 9/1999 | Lee | H05K 7/2019 165/104.34 |
|---|---|---|---|---|---|
| 8,023,265 | B2 | | 9/2011 | Yang et al. | |
| 8,405,987 | B2 | * | 3/2013 | Lai | H05K 7/20727 361/679.48 |
| 8,693,184 | B2 | * | 4/2014 | Wu | G06F 1/203 361/709 |
| 8,926,414 | B1 | * | 1/2015 | Kirkpatrick | G06F 1/203 361/679.41 |
| 9,575,524 | B1 | * | 2/2017 | Prather | G06F 1/1662 |
| 9,907,201 | B2 | * | 2/2018 | Degner | H05K 7/20145 |
| 10,682,773 | B2 | | 6/2020 | Wagner et al. | |
| 2004/0105233 | A1 | * | 6/2004 | Lai | H05K 7/202 361/695 |
| 2008/0128119 | A1 | * | 6/2008 | Ali | G06F 1/203 165/122 |
| 2014/0192468 | A1 | * | 7/2014 | Kotaka | G06F 1/1616 361/679.55 |

(Continued)

FOREIGN PATENT DOCUMENTS

| CN | 100529426 C | 8/2009 |
|---|---|---|
| CN | 101832280 A | 9/2010 |

(Continued)

*Primary Examiner* — Stephen S Sul
(74) *Attorney, Agent, or Firm* — McClure, Qualey & Rodack, LLP

(57) ABSTRACT

Provided is an electronic device. The electronic device includes a housing, a heat generating element, a plurality of fans, and a guide structure. The housing includes a first outlet. The heat generating element is disposed in the housing. The fans are disposed in the housing. Each fan includes a second outlet. The second outlets at least partially face the interior of the housing. The guide structure is disposed in the housing, and is at least partially located between the fans. The guide structure at least partially extends toward the first outlet.

8 Claims, 4 Drawing Sheets

(56) References Cited

U.S. PATENT DOCUMENTS

| | | | | |
|---|---|---|---|---|
| 2015/0084490 A1* | 3/2015 | Fujiwara | ............... | G06F 1/203 |
| | | | | 312/236 |
| 2017/0059263 A1* | 3/2017 | Sun | ............... | H05K 7/20181 |
| 2017/0115707 A1* | 4/2017 | Ho | ............... | G06F 1/203 |
| 2018/0088637 A1* | 3/2018 | Uchino | ............... | F28D 15/0275 |
| 2018/0314305 A1* | 11/2018 | Dolzer | ............... | H05K 7/20172 |
| 2020/0039095 A1 | 2/2020 | Wagner et al. | | |
| 2020/0081505 A1* | 3/2020 | Ma | ............... | G06F 1/203 |
| 2020/0201402 A1* | 6/2020 | Lee | ............... | G06F 1/20 |

FOREIGN PATENT DOCUMENTS

| | | |
|---|---|---|
| CN | 101922463 A | 12/2010 |
| CN | 110235536 A | 9/2019 |

\* cited by examiner

ELECTRONIC DEVICE

CROSS-REFERENCE TO RELATED APPLICATION

This application claims the priority benefit of Taiwan Application Serial No. 109100983, filed on Jan. 10, 2020. The entirety of the above-mentioned patent application is hereby incorporated by reference herein and made a part of specification.

BACKGROUND OF THE INVENTION

Field of the Invention

The disclosure relates to an electronic device.

Description of the Related Art

Notebook computers today not only for a work purpose but also for E-sport programs. Such notebook computers are generally referred to as E-sports notebook computers. In recent years, what E-sports notebook computers strive for is to maximize its performance as well as its outward appearance for lighter and portable design.

Meanwhile, such E-sports notebook computers with light and portable design require high performance and effectively heat dissipation as well, to avoid excessively high temperature during operation.

BRIEF SUMMARY OF THE INVENTION

The disclosure provides an electronic device, including a housing, a heat generating element, a plurality of fans, and a guide structure. The housing includes a first outlet. The heat generating element is disposed in the housing. The fans are disposed in the housing. Each fan includes a second outlet. The second outlets at least partially face the interior of the housing. The guide structure is disposed in the housing, and is at least partially located between the fans. The guide structure at least partially extends toward the first outlet.

In the disclosure, air flow generated from the fans is guided by the guide structure to first flow though the heat generating element. In this way, heat generated by the heat generating element is taken away by the air flow while the heated air leaves the housing through the first outlet. Therefore, heat generated during operation is effectively dissipated from the housing. In other words, the electronic device effectively and specifically improves a heat dissipation effect. In addition, a heat dissipation manner disclosed here accompanying with the fans and the guide structure does not increase the thickness of the electronic device, and keeps the electronic device thin.

In the disclosure, the guide structure is at least partially located between the fans, the air flow generated from two fans does not interfere with each other, which avoids turbulence and improves heat dissipation of the electronic device.

DETAILED DESCRIPTION OF THE EMBODIMENTS

A plurality of embodiments of the disclosure are disclosed below with reference to the accompanying drawings, and for clear description, many practical details are described together in the following description. However, it should be understood that, the practical details are not used to limit the disclosure. In other words, in some embodiments of the disclosure, the practical details are not essential. In addition, for brevity of the accompanying drawings, some conventional structures and elements in the accompanying drawings are depicted through simple examples. If possible during implementation, features in different embodiments are interchangeably applied.

Figure 1:
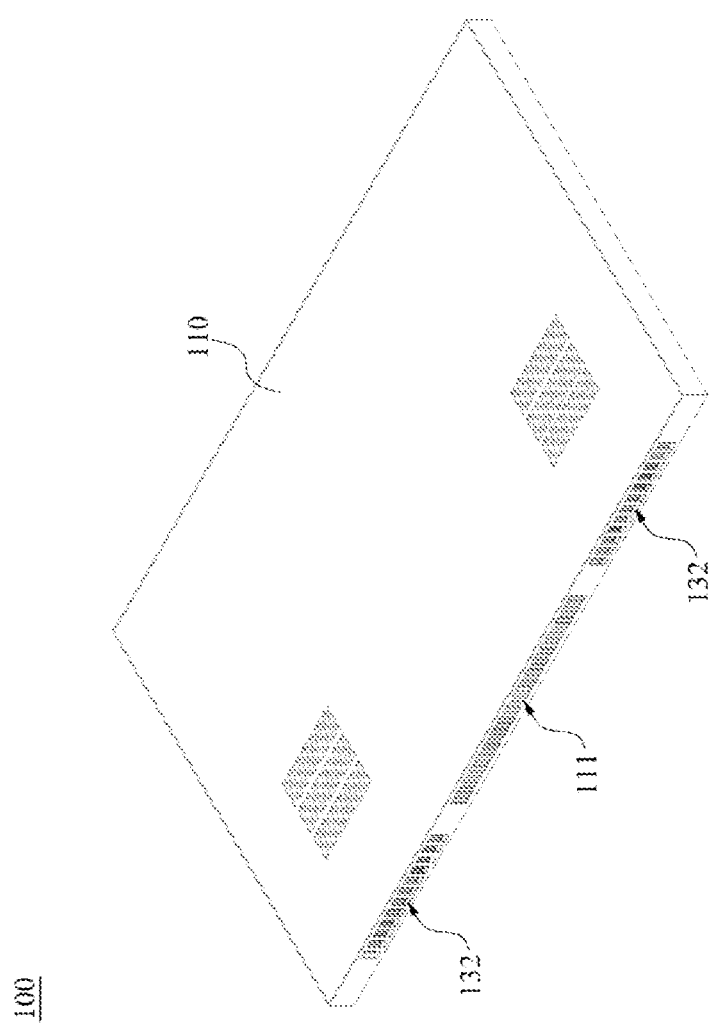
FIG. 1 is a schematic three-dimensional diagram of an electronic device according to an embodiment of the disclosure.

FIG. 1 is a schematic diagram showing three-dimensions of an electronic device 100 according to an embodiment of the disclosure. In this embodiment, as shown in FIG. 1, the electronic device 100 includes a housing 110. The housing 110 includes a first outlet 111. In an embodiment, the electronic device 100 is a heat dissipation base dedicated to a notebook computer or a high-performance notebook computer applicable to E-sports programs.

Figure 2:
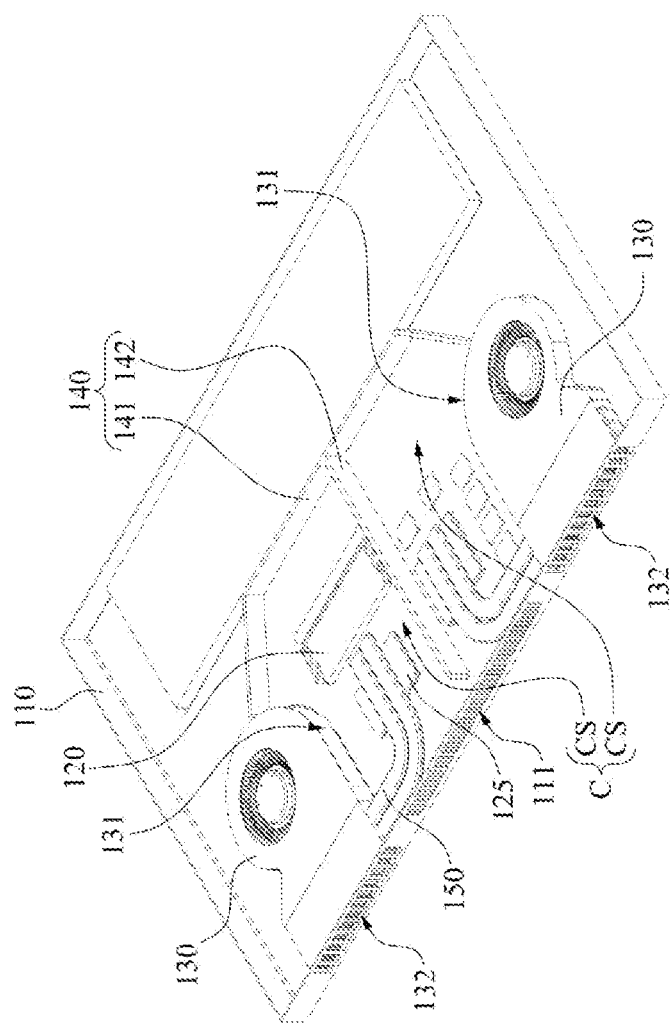
FIG. 2 is a perspective view of the electronic device in FIG. 1.

FIG. 2 is a perspective view of the electronic device 100 in FIG. 1. In this embodiment, the electronic device 100 further includes at least one heat generating element 120, a plurality of fans 130, and at least one guide structure 140. In an embodiment, as shown in FIG. 2, two fans 130 are illustrated. The heat generating element 120 is disposed in the housing 110. The fans 130 are also disposed in the housing 110. Each fan 130 includes a second outlet 131. The fans 130 generate air flow toward the second outlets 131.

It should be noted that, the second outlets 131 of the two fans 130 separately at least partially face the interior of the housing 110. Therefore, the fans 130 blow air toward the interior of the electronic device 100. The guide structure 140 is disposed in the housing 110, and is at least partially located between the fans 130. The guide structure 140 at least partially extends toward the first outlet 111 of the housing 110, to guide the air flow from the fans 130 though the heat generating element 120 and then leave the housing 110 through the first outlet 111.

When an operator operates the electronic device 100, the heat generating element 120 operates and generates heat. As described above, the air flow from the fans 130 is guided by the guide structure 140 to first flow though the heat generating element 120. In this way, the heat of the heat generating element 120 is taken away by the air flowing through the heat generating element 120, and the heated air leaves the housing 110 through the first outlet 111. Therefore, waste heat generated by the heat generating element 120 during operation is effectively released from the housing 110, that is, the electronic device 100.

In addition, a heat dissipation manner in which the fans 130 and the guide structure 140 are combined does not increase the thickness of the electronic device 100 and keeps thin appearance design of the electronic device 100.

Structurally, the guide structure 140 includes a guiding portion 141. The guiding portion 141 and the fans 130 together define a chamber C. Specifically, the chamber C is surrounded by the guiding portion 141 and the fans 130, and the heat generating element 120 is located in the chamber C.

Further, the guide structure 140 includes an extending portion 142. The extending portion 142 is connected to the guiding portion 141. The extending portion 142 extends toward the first outlet 111 of the housing 110, to divide the chamber C into two sub-chambers CS. More specifically, the heat generating element 120 is located in one of the sub-chambers CS. The first outlet 111 of the housing 110 is in communication with the sub-chambers CS.

In an embodiment, as shown in FIG. 2, the extending portion 142 of the guide structure 140 is at least partially located between the two fans 130. The respective second outlets 131 of the two fans 130 are in communication with corresponding sub-chambers CS and at least partially face the guide structure 140. In this way, when a user operates the electronic device 100, the fans 130 draw air outside the housing 110, and blows the air from the second outlets 131. The air flowed from the second outlets 131 is guided by the guiding portion 141 of the guide structure 140 to first flow through the heat generating element 120. The air is then guided by the extending portion 142 to flow to the first outlet 111 of the housing 110 to leave the housing 110.

As described above, because the extending portion 142 of the guide structure 140 is at least partially located between the two fans 130, the air flow from the two fans 130 does not interfere with each other to cause turbulence, so that a heat dissipation effect for the electronic device 100 is effectively improved.

Structurally, the extending portion 142 of the guide structure 140 is located between the guiding portion 141 of the guide structure 140 and the first outlet 111 of the housing 110. To further stabilize an air flow in the sub-chambers CS, an extending direction of the extending portion 142 of the guide structure 140 is perpendicular to the first outlet 111 of the housing 110. In this way, a possibility that turbulence that generated in the sub-chambers CS is further reduced.

In addition, in this embodiment, as shown in FIG. 1 and FIG. 2, each fan 130 includes a first inlet 132. The first outlet 111 of the housing 110 and the first inlets 132 of the fans 130 are coplanar with each other. Specifically, the first inlet 132 of the fan 130 and the first outlet 111 of the housing 110 are located on the same outer surface of the housing 110. Further, a corresponding chamber C is located between the fans 130. The first outlet 111 of the housing 110 is located between the first inlets 132 of the fans 130.

In another aspect, the electronic device 100 further includes another element that generates heat, for example, a heat generating element 125. As shown in FIG. 2, the heat generating element 125 is also disposed in the housing 110. Moreover, the heat generating element 125 is connected to a position near the first inlet 132 of the fan 130 by a heat transfer pipe 150. Specifically, when a user operates the electronic device 100, the heat generated by the heat generating element 125 is at least partially transferred to the position near the first inlet 132 of the fan 130 by the heat transfer pipe 150. In this way, when air enters the fan 130, the temperature of the heat transfer pipe 150 that increases due to the heat generating element 125 is effectively reduced, thereby helping improve a heat dissipation effect for the heat generating element 125.

Further, as described above, the heat of the heat generating element 125 is also taken away by air flowing through the heat generating element 125, and the heated air leaves the housing 110 through the first outlet 111. Therefore, the heat generated by the heat generating element 125 during operation is effectively released from the housing 110, that is, the electronic device 100.

Figure 3:
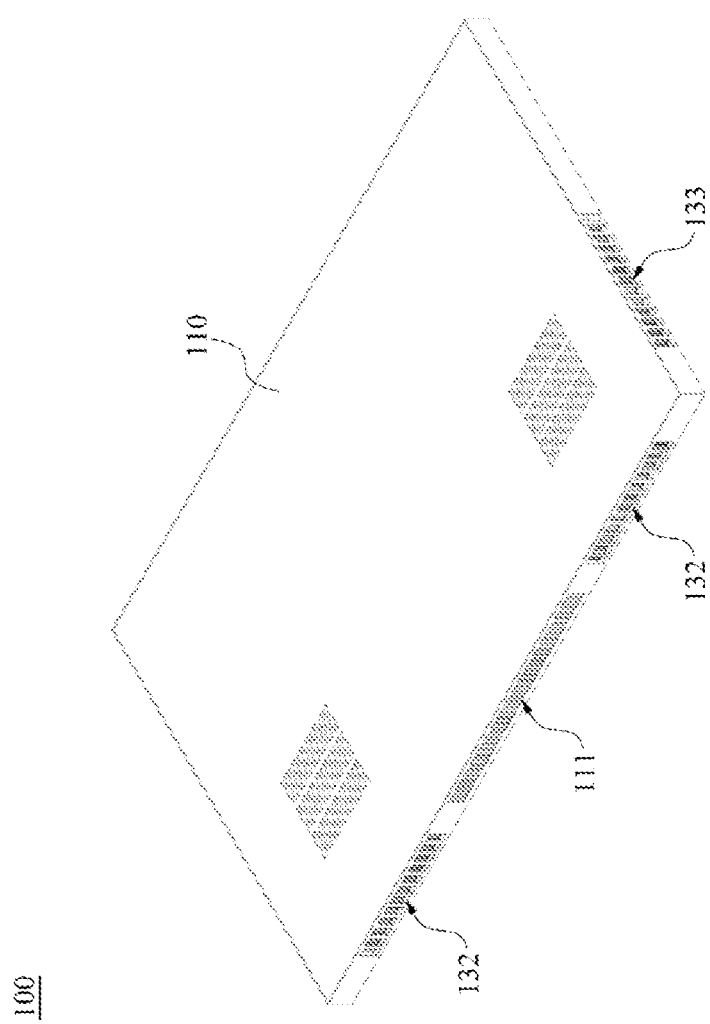
FIG. 3 is a schematic three-dimensional diagram of an electronic device according to another embodiment of the disclosure.
Figure 4:
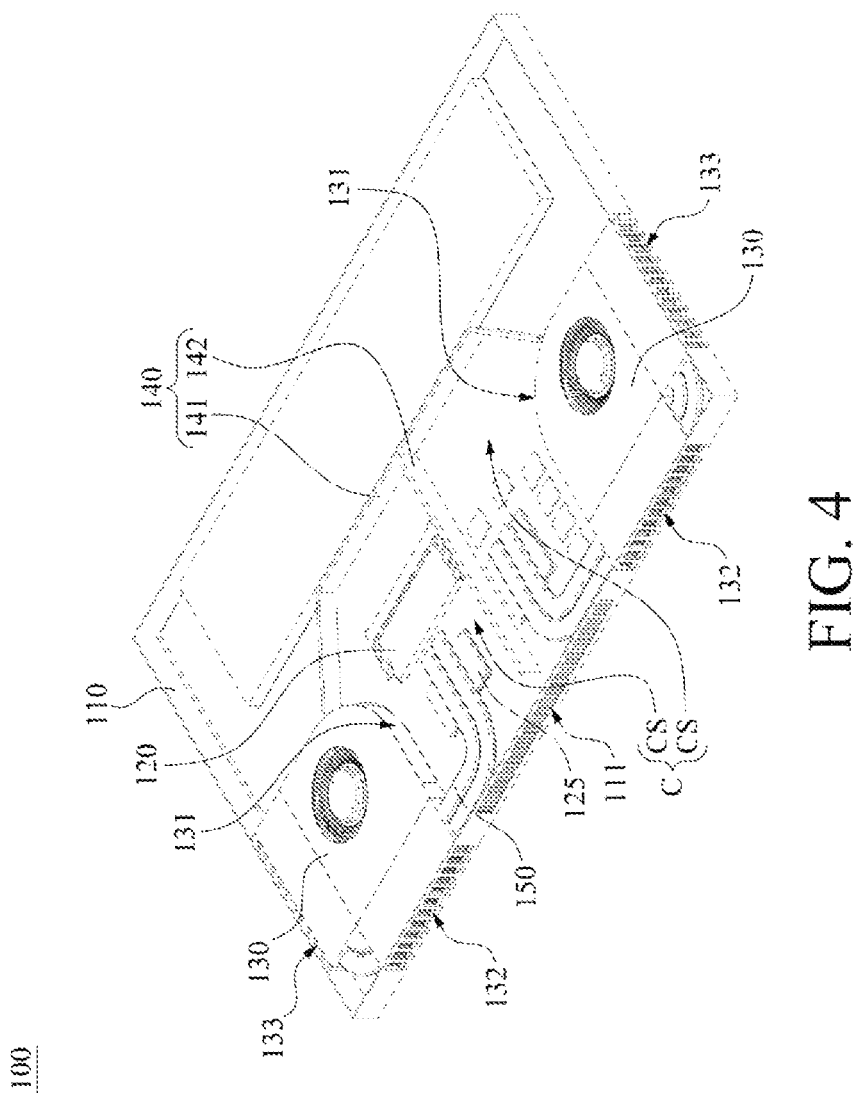
FIG. 4 is a perspective view of the electronic device in FIG. 3.

FIG. 3 is a schematic three-dimensional diagram of an electronic device 100 according to another embodiment of the disclosure. FIG. 4 is a perspective view of the electronic device 100 in FIG. 3. In this embodiment, as shown in FIG. 3 and FIG. 4, each fan 130 includes a first inlet 132 and a second inlet 133. A first outlet 111 of a housing 110 and the first inlets 132 of the fans 130 are coplanar with each other, and the second inlet 133 of the fan 130 is perpendicular to a corresponding first inlet 132.

Specifically, the first inlet 132 and the second inlet 133 of the fan 130 are separately located on two adjacent outer surfaces of the housing 110 that are perpendicular to each other.

In conclusion, in the disclosure, because an extending portion of a guide structure is at least partially located between fans, air blown from two fans does not interfere with each other to cause turbulence, so that a heat dissipation effect of an electronic device is effectively improved. To further stabilize an air flow in sub-chambers CS, an extending direction of the extending portion of the guide structure is perpendicular to a first outlet of a housing. In this way, a possibility that turbulence is generated in the sub-chambers is further reduced.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. An electronic device, comprising:
a housing, comprising a first outlet;
a heat generating element, disposed in the housing;
a plurality of fans, disposed in the housing, each fan of the plurality of fans comprises a second outlet, the second outlets at least partially face an interior of the housing; and
a guide structure, disposed in the housing, and at least partially located between the plurality of fans, the guide structure comprising a guiding portion and an extending portion connected to the guiding portion, the guiding portion and the plurality of fans together defining a chamber, the extending portion extending toward the first outlet to divide the chamber into two sub-chambers, and the heat generating element being located in one of the two sub-chambers.

2. The electronic device according to claim 1, wherein the second outlets separately at least partially face the guide structure.

3. The electronic device according to claim 1, wherein the plurality of fans comprise two fans, the extending portion is at least partially located between the two fans, and each second outlet is in communication with a corresponding sub-chamber of the two sub-chambers.

4. The electronic device according to claim 1, wherein an extending direction of the extending portion is perpendicular to the first outlet.

5. The electronic device according to claim 1, wherein the first outlet is in communication with the two sub-chambers.

6. The electronic device according to claim 1, wherein the extending portion is located between the guiding portion and the first outlet.

7. The electronic device according to claim 1, wherein the first outlet is located between the first inlets.

8. The electronic device according to claim 1, wherein each fan of the plurality of fans comprises a first inlet and a second inlet, the first outlet and the first inlets are coplanar with each other, and each second inlet is perpendicular to a corresponding first inlet.

\* \* \* \* \*